United States Patent
Wei et al.

(10) Patent No.: US 11,443,966 B2
(45) Date of Patent: Sep. 13, 2022

(54) SEMICONDUCTOR PROCESSING FLOW FIELD CONTROL APPARATUS AND METHOD

(71) Applicant: Taiwan Semiconductor Manufacturing Co., Ltd., Hsinchu (TW)

(72) Inventors: Kai-Chin Wei, Hsinchu (TW); Che-fu Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/746,369

(22) Filed: Jan. 17, 2020

(65) Prior Publication Data
US 2021/0225673 A1 Jul. 22, 2021

(51) Int. Cl.
*H01L 21/67* (2006.01)
*H01L 21/02* (2006.01)

(52) U.S. Cl.
CPC .. *H01L 21/67161* (2013.01); *H01L 21/67276* (2013.01); *H01L 21/02005* (2013.01)

(58) Field of Classification Search
CPC ............... H01L 21/67063; H01L 21/67069
See application file for complete search history.

(56) References Cited

U.S. PATENT DOCUMENTS

| | | | |
|---|---|---|---|
| 2015/0170945 A1* | 6/2015 | Segawa | H01L 21/67772 414/217 |
| 2017/0084470 A1 | 3/2017 | Suzuki et al. | |
| 2018/0047602 A1* | 2/2018 | Kawai | H01L 21/67389 |
| 2019/0287834 A1* | 9/2019 | Woo | H01L 21/67017 |
| 2021/0013077 A1* | 1/2021 | Kawai | H01L 21/67393 |

FOREIGN PATENT DOCUMENTS

| | | |
|---|---|---|
| TW | 200910495 A | 3/2009 |
| TW | I335618 B | 1/2011 |
| TW | 201637112 A | 10/2016 |

* cited by examiner

*Primary Examiner* — Jae Lee
(74) *Attorney, Agent, or Firm* — Seed IP Law Group LLP

(57) ABSTRACT

Systems, apparatuses, and methods are provided for predicting or determining irregular processing parameters during processing of a semiconductor wafer in a semiconductor processing apparatus, such as an etching apparatus. A semiconductor processing apparatus includes a load port that is configured to receive a semiconductor wafer. A process chamber is coupled to the load port, and a fan is configured to selectively vary a flow of fluid in the process chamber. One or more sensors are provided in the process chamber and are configured to sense one or more processing parameters in the process chamber. A controller is coupled to the one or more sensors and to the fan, and the controller is configured to control the fan to vary the flow of fluid in the process chamber based on the sensed one or more processing parameters.

20 Claims, 4 Drawing Sheets

SEMICONDUCTOR PROCESSING FLOW FIELD CONTROL APPARATUS AND METHOD

BACKGROUND

During fabrication of semiconductor devices, semiconductor wafers are processed by a variety of processing tools or apparatuses. As an example, during an etching process, an etching apparatus may be utilized to process a wafer. Conditions within the etching apparatus may vary depending upon various factors, such as the particular recipe used during the etching, the length of time the etching is performed, humidity or water vapor that is introduced or that develops during the etching, temperature, and so on.

Outgassing can occur at a surface of a wafer undergoing an etching process, and the outgassing can in some cases be the result of the conditions within the etching apparatus.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
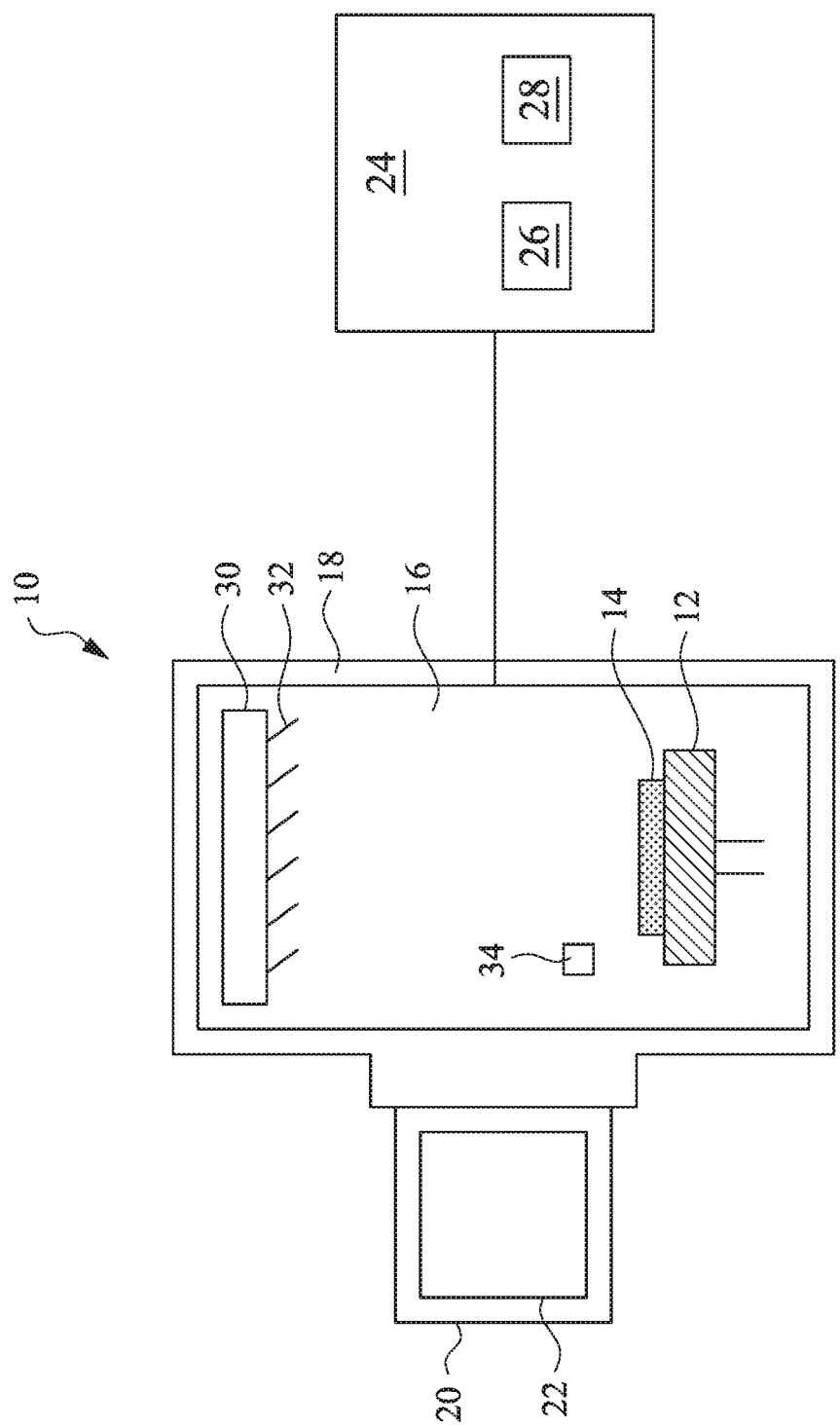
FIG. 1 is a schematic diagram illustrating a semiconductor processing apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, the present disclosure provides systems, apparatuses, and methods in which a flow field in a process chamber may be controlled during operation based on sensed parameters in the process chamber. The control of the flow field may be accomplished, at least in part, by controlling a fan or a fin of a fan in the process chamber to adjust the flow of fluid in the process chamber.

Embodiments provided herein include systems, apparatuses, and methods for determining irregular processing parameters in a semiconductor processing apparatus based on one or more processing parameters which are sensed by sensors in a process chamber of the apparatus. In some embodiments, machine learning techniques are utilized to analyze the sensed processing parameters, which analysis may be based at least in part on historical processing parameters associated with irregular process conditions that are stored in a processing parameters database.

FIG. 1 is a schematic diagram illustrating a semiconductor processing apparatus 10, in accordance with one or more embodiments of the present disclosure. The semiconductor processing apparatus 10 illustrated in FIG. 1 may be, for example, an etching-related semiconductor processing tool, such as a dry etching or plasma etching tool; however, embodiments of the present disclosure are not limited thereto. In various embodiments, the semiconductor processing apparatus 10 may be any apparatus or processing tool which is utilized in the processing of semiconductor devices.

The semiconductor processing apparatus 10 includes a wafer stage 12 on which a semiconductor wafer 14 is positioned during a semiconductor manufacturing process, such as an etching process. The wafer 14 may be a semiconductor wafer, which in some embodiments may include electrical features on a front side (e.g., the upper side as illustrated in FIG. 1) of the wafer 14. In some embodiments, the wafer 14 may be a monocrystalline silicon (Si) wafer, an amorphous Si wafer, a gallium arsenide (GaAs) wafer, or any other semiconductor wafer.

In an example in which the semiconductor processing apparatus 10 is a plasma etching tool, the semiconductor processing apparatus 10 may be configured to generate a high-speed stream of plasma (e.g., charged ions) of a desired gas mixture and to direct the plasma stream to the wafer 14. The plasma generates volatile etch products at room temperature from the chemical reactions between the elements of the material etched (e.g., the surface of the wafer 14) and the reactive species generated by the plasma. Based on the type of plasma and the type of material on the wafer 14, the collision of the charged particles of the plasma with the material of the wafer 14 dislodges that material, effectively removing it from the surface of the wafer 14. Other types of plasma etching may be used in accordance with principles described herein.

The wafer stage 12 is located within a process chamber 16 of the semiconductor processing apparatus 10. The process chamber 16 may be at least partially surrounded by a housing 18. For example, the process chamber 16 may be enclosed within the housing 18.

In various embodiments, additional components may be located within the process chamber 16, depending on a type of semiconductor process that is implemented by the semiconductor processing apparatus 10. For example, in some embodiments, one or more electrodes are located within the process chamber 16 and are configured to create an electromagnetic field which creates plasma from a precursor gas that is injected into the process chamber 16. In such embodiments, a lower electrode may be positioned below the semiconductor wafer 14, and an upper electrode may be positioned above the semiconductor wafer 14.

The process chamber 16 may include one or more fluid inlets or outlets for receiving or exhausting fluids. For example, the process chamber 16 may be in fluid communication with gas sources which provide various precursor gases to the process chamber 16 for the various fabrication processes that are performed by the semiconductor processing apparatus 10. In some embodiments, the process chamber 16 may be a vacuum chamber, and the process chamber 16 may be in fluid communication with a negative pressure or vacuum in order to purge gas from the chamber.

As described previously herein, the semiconductor processing apparatus 10 may be any apparatus or processing tool which is utilized in the processing of semiconductor devices. Similarly, the process chamber 16 is an example of a process chamber which may be utilized in the semiconductor processing apparatus 10; however, embodiments provided herein are not limited to the process chamber 16 illustrated in FIG. 1. In various embodiments, any components or features which may be utilized in any of a variety of semiconductor processing tools may be located within or associated with the process chamber 16.

The semiconductor processing apparatus 10 includes a load port 20 which is configured to receive a plurality of wafers. For example, in some embodiments, the load port 20 is configured to receive a front opening universal pod (FOUP) 22 that carries a plurality of wafers. The FOUP 22 is configured to transport wafers between various devices used during the manufacturing of semiconductor devices. In some embodiments, the FOUP 22 includes fins or rails which protrude from interior sidewalls and which hold the wafers in place. In some embodiments, the FOUP 22 is capable of storing up to 25 wafers at a time. In some embodiments, the FOUP 22 is capable of storing more or less than 25 wafers at a time. The FOUP 22 is configured to facilitate insertion and removal of wafers through a front opening door. In some embodiments, a robotic handling system is used to insert and remove wafers from the FOUP 22. In some embodiments, the interior environment of the FOUP 22 is controlled to help maintain a low moisture content and to reduce the risk of contaminating particles adhering to wafers stored within the FOUP 22.

During use, wafers in the FOUP 22 may be introduced into the process chamber 16, for example, by a robotic handling system, a robotic arm, or the like. In some embodiments, the wafers may remain in the FOUP 22 and may be in fluid communication with the process chamber 16 such that the wafers in the FOUP 22 may be processed, for example, by etching, while positioned within the FOUP 22. In other embodiments, the wafers may be moved one at a time into the process chamber, for example, positioned on the wafer stage 12 for processing by the semiconductor processing apparatus 10.

The wafer stage 12 is configured to support the semiconductor wafer 14 during processing of the wafer 14 in the semiconductor processing apparatus 10. The wafer stage 12 may be any structure that supports, holds, or secures the wafer 14 during processing.

In some embodiments, the semiconductor wafer 14 may be placed on the wafer stage 12 by a movable wafer handling structure, such as a robotic arm or any movable robotic structure capable of securing and transporting the semiconductor wafer 14 to the wafer stage 12. The movable wafer handling structure, such as a robotic arm, may similarly remove the semiconductor wafer 14 and transport the wafer 14 to another location, such as to a buffer chamber, another process chamber, a transfer chamber, or the like, after the semiconductor wafer 14 has been processed in the process chamber 16.

In some embodiments, the semiconductor processing apparatus 10 includes a controller or control circuitry 24 (which may be referred to herein as control system 24) that controls one or more operations of the semiconductor processing apparatus 10. For example, in various embodiments, the control system 24 may control generation of plasma, flows of fluid into or out of the process chamber 16, electrical energy applied to one or more electrodes within the process chamber 16, heating or other environmental parameters of the process chamber 16, or the like. In some embodiments, the control system 24 may control operations of one or more robotic mechanisms, such as a robotic arm or movable robotic structure which may be manipulated to move a semiconductor wafer 14 onto or off of the wafer stage 12.

The control system 24 may include a processor 26 and a computer-readable memory 28. The memory 28 may include machine readable instructions that when executed by the processor 26, cause the control system 24 to send command signals to the one or more components of the semiconductor processing apparatus 10, such as a plasma generation component, gas inlet or outlet mechanisms, one or more electrodes, or the like.

The semiconductor processing apparatus 10 includes a fan 30, which may be positioned within or in fluid communication with the process chamber 16. The fan 30 is configured to provide a flow of fluid (e.g., air or any fluid present within the process chamber 16) which may be used to maintain or control a flow field (e.g., a field of fluid flow) to remove outgassing at the surface of the wafer 14. The fan 30 may include fins 32 which are mechanically coupled to the fan 30 and which direct the flow of fluid provided by the fan 30. In some embodiments, the fins 32 may be variable fins, for example, the position or orientation (e.g., the angle) of the fins may be selectively varied to direct the flow of fluid in a desired manner. Positioning of the fins, including the angle of the fins, may be controlled by control of a motor or actuator that is coupled to the fins and operable to move the fins to a desired position. The flow of fluid may thus be directed as desired, which may be utilized to control or remove outgassing of the surface of the wafer 14. In some embodiments, the flow of fluid provided by the fan 30 may be directed toward the surface (e.g., upper surface as shown in FIG. 1) of the wafer 14, and the direction and speed of the flow field may be selectively varied by the fan 30 and the fins 32.

Further, as shown in FIG. 1, the semiconductor processing apparatus 10 may include one or more sensors 34 configured to sense one or more parameters of the semiconductor processing performed by the semiconductor processing apparatus 10. The one or more sensors 34 may be positioned in any suitable location within the semiconductor processing apparatus 10 for sensing or measuring various processing parameters of the semiconductor processing apparatus 10. In some embodiments, the one or more sensors 34 may be positioned within the process chamber 16. For example, the one or more sensors 34 may be suspended within the process chamber 16 at any suitable or desired location by one or more supports which may extend, for example, from side walls, upper surfaces, lower surfaces, or any suitable surface of the process chamber 16. In some embodiments, the one or more sensors 34 may be positioned over the wafer 14; however, embodiments are not limited thereto.

In some embodiments, the one or more sensors 34 may include at least one of a flow meter, a hygrometer, a thermometer, or a gas detector. For example, in some embodiments, the one or more sensors 34 may include a flow meter, which is configured to sense or measure a linear, nonlinear, mass or volumetric flow rate of a liquid or a gas, such as the flow rate of the flow of fluid that is provided by the fan 30. In some embodiments, the one or more sensors 34 may therefore sense a speed of the fluid flow provided by the fan 30, and the sensed speed may be utilized, for example, by the controller 24, to adjust speed of the fluid flow provided by the fan 30 as desired.

In some embodiments, the one or more sensors 34 may include a hygrometer, which is configured to sense or measure an amount of humidity or water vapor in an atmosphere, such as within the process chamber 16. The amount of humidity or water vapor may be monitored by the one or more sensors 34, and the amount of humidity or water vapor may be controlled, for example, by the controller 24 based on the sensed or measured humidity or water vapor. For example, the controller 24 may adjust one or more chemicals, gases, or the like introduced into the process chamber 16 in order to adjust or control the amount of humidity or water vapor in the process chamber 16.

In some embodiments, the one or more sensors 34 may include a thermometer configured to sense or measure temperature or a temperature gradient in an atmosphere, such as within the process chamber 16. The temperature may be monitored by the one or more sensors 34, and the temperature may be controlled, for example, by the controller 24 based on the sensed or measured temperature. For example, the controller 24 may control a heating element to increase or decrease the temperature in the process chamber 16 based on the sensed or measured temperature. In some embodiments, the controller 24 may adjust the temperature in the process chamber 16 by controlling or adjusting the flow field within the process chamber 16.

In some embodiments, the one or more sensors 34 may include a gas detector configured to sense or measure the presence of gases in an atmosphere, such as within the process chamber 16. The gases within the process chamber 16 may be monitored by the one or more sensors 34, and the gases may be controlled, for example, by the controller 24 based on the sensed or measured gases. For example, the controller 24 may adjust a flow of one or more gases introduced into the process chamber 16 in order to adjust or control the types or amounts of gases in the process chamber 16, based on the gases detected by the one or more sensors 34. In some embodiments, the controller 24 may adjust or control the gases in the process chamber 16 by adjusting the flow field within the process chamber 16, which may, for example, adjust or control outgassing at the surface of the wafer 14.

Any additional features or components may be included in the semiconductor processing apparatus 10, which may include, for example, any additional features or components of a semiconductor processing apparatus (for example, an etching apparatus) that may be known by those skilled in the field of semiconductor processing tools or apparatuses.

As will be discussed in further detail later herein, the various parameters of the semiconductor processing performed by the semiconductor processing apparatus 10 which are sensed or measured by the one or more sensors 34 may be analyzed to determine processing conditions (e.g., within the process chamber 16) which may be utilized to maintain desired processing conditions to reduce or eliminate irregularities or undesirable conditions during processing by the semiconductor processing apparatus 10. Irregular or abnormal processing conditions can lead to undesirable effects of the processing of the wafer 14, such as various defects which may result from outgassing at the surface of the wafer 14.

By sensing or measuring the various processing parameters of the semiconductor processing apparatus 10 by the one or more sensors 34, and analyzing the sensed or measured parameters, irregularities in the processing parameters of the semiconductor processing apparatus 10 may be detected, which facilitates remediation of the irregular or undesired parameters, thereby preventing or reducing the occurrence of the defects in the wafer 14, for example, due to outgassing at the surface of the wafer 14. The processing parameters may be adjusted, based on the sensed or measured processing parameters, for example, by adjusting the flow of fluid in the process chamber 16, e.g., by adjusting a speed of the fan 30, angle of the fins 32, or the like. In some embodiments, the controller 24 may be utilized to control one or more of the speed of the fan 30, fan direction (e.g., by adjusting the angle or orientation of the fins 32), the frequency of the fan 30, or an angle of opening of the door of the load port 20 (which may adjust an amount of fluid flow directed into or otherwise received by the FOUP 22).

Figure 2:
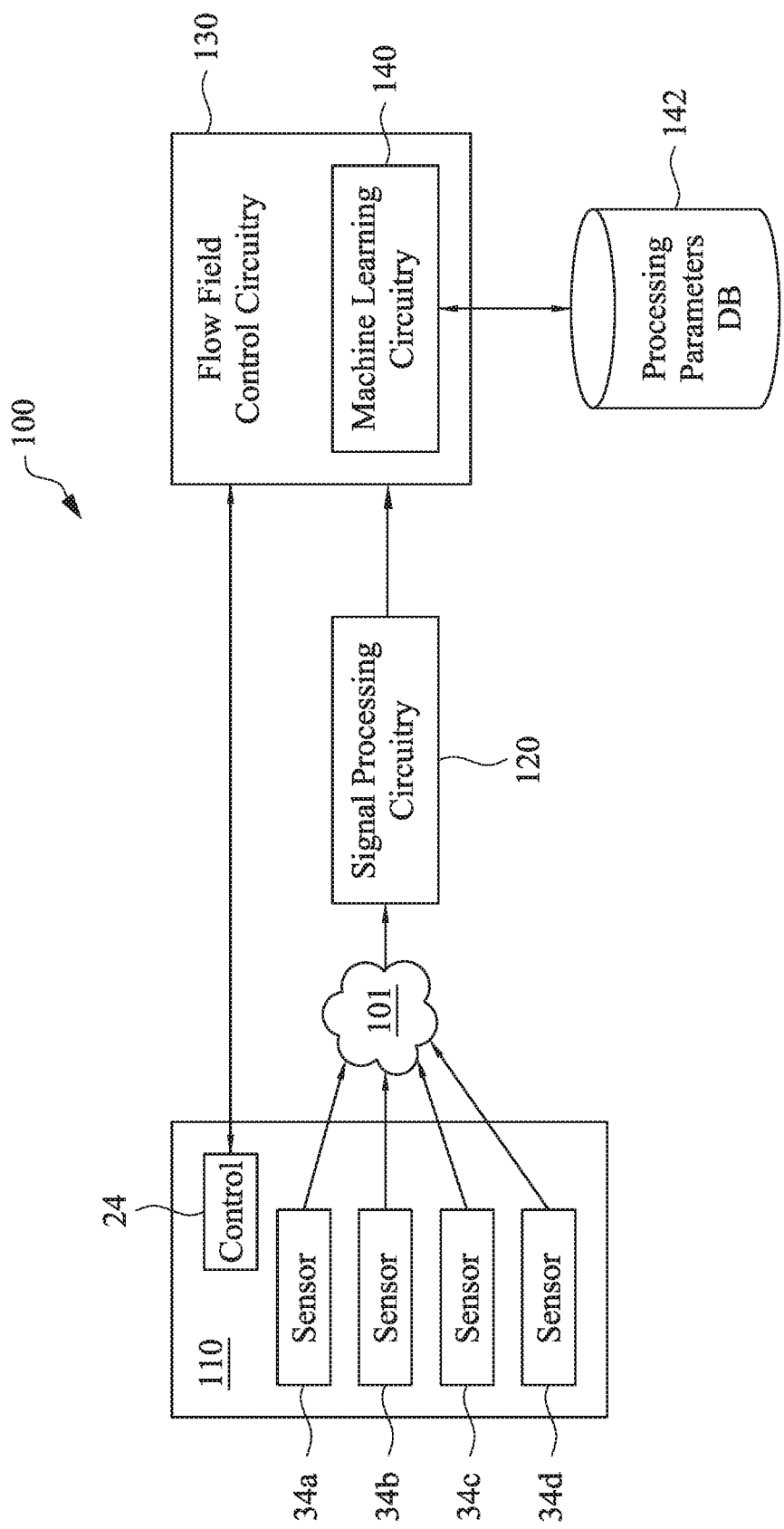
FIG. 2 is a block diagram illustrating a semiconductor processing flow field control system, in accordance with some embodiments.

FIG. 2 is a block diagram illustrating a semiconductor processing flow field control system 100, in accordance with embodiments of the present disclosure. The flow field control system 100 may be used in conjunction with, and may include one or more of the features and functionality of, a semiconductor processing apparatus 110, which may be, for example, the semiconductor processing apparatus 10 shown in FIG. 1. However, embodiments provided by the present disclosure are not limited thereto. In various embodiments the semiconductor processing apparatus 110 may be any apparatus that is used during a semiconductor device manufacturing process, including, for example, apparatuses for performing chemical vapor deposition (CVD), physical vapor deposition (PVD), etching, lithography, or any other semiconductor processing apparatus or tool. In some embodiments, the semiconductor processing apparatus 110 is included as part of the flow field control system 100. The flow field control system 100 may be utilized to detect irregularities or undesired processing conditions during processing of one or more wafers by the semiconductor processing apparatus 110, based on one or more processing parameters sensed by one or more sensors 34.

As shown in FIG. 2, the semiconductor processing apparatus 110 may include a first sensor 34a, a second sensor 34b, a third sensor 34c, and a fourth sensor 34d. However, embodiments are not limited thereto, and in various embodiments, fewer or more sensors may be included in the semiconductor processing apparatus 110.

The sensors 34a-34d may be located at any suitable location within the semiconductor processing apparatus 110 and are configured to sense processing parameters of the semiconductor processing apparatus 110. In various embodiments, the sensors 34a-34d may be any of the one or more sensors 34 described previously herein with respect to FIG. 1, and may be any of a flow meter, a hygrometer, a thermometer, or a gas detector. In some embodiments, the first sensor 34a may be a flow meter, the second sensor 34b may be a hygrometer, the third sensor 34c may be a thermometer, and the fourth sensor 34d may be a gas detector.

As shown in FIG. 2, the flow field control system 100 includes signal processing circuitry 120 and flow field control circuitry 130.

The sensors 34a-34d are communicatively coupled to the signal processing circuitry 120 so that the signal processing circuitry 120 receives signals output by the sensors 34a-34d that are indicative of the sensed or measured parameters of the semiconductor processing apparatus 110, such as sensed or measured parameters associated with rate or speed of the fluid flow, an amount of humidity or water vapor, temperature, or gases present in the processing environment. The 34a-34d may be communicatively coupled to the signal processing circuitry 120 by any suitable communications network 101. The communications network 101 may utilize one or more protocols to communicate via one or more physical networks, including local area networks, wireless networks, dedicated lines, intranets, the Internet, and the like.

In some embodiments, the communications network 101 includes one or more electrical wires which communicatively couple the sensors 34a-34d to the signal processing circuitry 120. In some embodiments, the communications network 101 may include a wireless communications network for communicating signals from any of the sensors 34a-34d to the signal processing circuitry 120. Any of the sensors 34a-34d, as well as the signal processing circuitry 120, may include wireless communications circuitry which facilitates wireless communications between the sensors 34a-34d and the signal processing circuitry 120.

The signal processing circuitry 120 may be or include any electrical circuitry configured to perform any signal processing techniques for processing signals from the sensors 34a-34d to generate suitable outputs for analysis by the flow field control circuitry 130. In some embodiments, the signal processing circuitry 120 may include or be executed by a computer processor, a microprocessor, a microcontroller, or the like, configured to perform the various functions and operations described herein with respect to the signal processing circuitry 120. For example, the signal processing circuitry 120 may be executed by a computer processor selectively activated or reconfigured by a stored computer program, or may be a specially constructed computing platform for carrying out the features and operations described herein. In some embodiments, the signal processing circuitry 120 may be configured to execute software instructions stored in any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The signal processing circuitry 120 receives and processes signals output by the sensors 34a-34d. In some embodiments, the signal processing circuitry 120 includes an analog-to-digital (ADC) converter, which converts analog signals (e.g., as may be received from the sensors 34a-34d) into digital signals. The digital signals, for example, as output by the ADC, may be separately processed by the signal processing circuitry 120 so that signals from each of the sensors 34a-34d are separately processed for suitability of analysis by the flow field control circuitry 130.

In some embodiments, the signal processing circuitry 120 may combine the signals received from each of the sensors 34a-34d into a single indicia of processing conditions. For example, the signals received from each of the sensors 34a-34d may be combined so that an output of the signal processing circuitry 120 indicates parameters associated with each of speed of the fluid flow, amount of humidity or water vapor, temperature, and gases present in the processing environment.

As shown in FIG. 2, the signal processing circuitry 120 is communicatively coupled to the flow field control circuitry 130. The flow field control circuitry 130 may include, or otherwise be executed by, a computer processor configured to perform the various functions and operations described herein. For example, the flow field control circuitry 130 may be executed by a computer processor selectively activated or reconfigured by a stored computer program, or may be a specially constructed computing platform for carrying out the features and operations described herein.

In some embodiments, the flow field control circuitry 130 includes memory which stores instructions for performing one or more of the features or operations described herein, and the flow field control circuitry 130 may be operable to execute instructions stored, for example, in the memory to perform the functions of the flow field control circuitry 130 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The flow field control circuitry 130 may receive signals associated with the processing parameters of the semiconductor processing apparatus 110, for example, from the signal processing circuitry 120. The flow field control circuitry 130 analyzes the received signals to determine a current state of the processing being performed by the semiconductor processing apparatus 110 (e.g., current processing parameters within a process chamber), and in some embodiments, the flow field control circuitry 130 may predict or determine irregularities in the processing parameters of the semiconductor processing apparatus 110, for example, based on a comparison of the received signals from the sensors 34a-34d with past data or analysis of the received signals by a machine learning model that is trained with past data (e.g., past sensor signals associated with particular processing parameters) indicative of irregular processing parameters of the semiconductor processing apparatus 110.

In some embodiments, the flow field control circuitry 130 may predict or determine irregular processing parameters of the semiconductor processing apparatus 110 by employing one or more artificial intelligence or machine learning techniques, which in some embodiments may be implemented at least in part by machine learning circuitry 140. Some or all of the analysis, determinations, or the like described herein that are made by the flow field control circuitry 130 may be performed automatically by the flow field control circuitry 130, for example, in response to receiving signals from the signal processing circuitry 120. The machine learning circuitry 140 may be included as part of the flow field control circuitry 130 (as shown), or may be remotely located and communicatively coupled with the flow field control circuitry 130. The machine learning circuitry 140 may predict or determine irregular or undesired processing parameters of the semiconductor processing apparatus 110 by using past data (e.g., the machine learning circuitry 140 may be trained based on past data) which indicates processing parameters (e.g., flow field speed, amount of humidity or water vapor, temperature, or gases present in the processing environment) that are known to be irregular, and the machine learning circuitry 140 may compare the received signals from the sensors 34a-34d with the past data to predict or determine the irregular processing parameters based on similarities or deviations from the past data or from a trained model contained within, managed by, or otherwise accessible to the machine learning circuitry 140.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as the received signals from the sensors 34a-34d associated with processing parameters of the semiconductor processing apparatus 110. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The flow field control circuitry 130 or the machine learning circuitry 140 may employ, for example, neural network, deep learning, convolutional neural network, Bayesian program learning, support vector machines, and pattern recognition techniques to solve problems such as predicting or determining irregular processing parameters of a semiconductor processing apparatus. Further, the flow field control circuitry 130 or the machine learning circuitry 140 may implement any one or combination of the following computational algorithms or techniques: classification, regression, supervised learning, unsupervised learning, feature learning, clustering, decision trees, or the like.

As one example, an artificial neural network may be utilized by the flow field control circuitry 130 or the machine learning circuitry 140 to develop, train, or update one or more machine learning models which may be utilized to predict or determine the irregular processing parameters. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data or past signals which are indicative of irregular processing parameters) to the input layer. Through training, the neural network may generate and/or modify the hidden layer, which represents weighted connections mapping the training data provided at the input layer to known output information at the output layer (e.g., classification of received sensing data as representative of irregular processing parameters, such as irregular flow field speed, amount of humidity or water vapor, temperature, or gases present in the processing environment). Relationships between neurons of the input layer, hidden layer, and output layer, formed through the training process and which may include weight connection relationships, may be stored, for example, as one or more machine learning models within or otherwise accessible to the machine learning circuitry 140.

Once the neural network has been sufficiently trained, the neural network may be provided with non-training data (e.g., new sensed or measured data received from the sensors 34a-34d during operation of the semiconductor processing apparatus 110) at the input layer. Utilizing irregular processing parameter knowledge (e.g., as stored in the machine learning model, and which may include, for example, weighted connection information between neurons of the neural network), the neural network may make determinations about the received sensed or measured data at the output layer. For example, the neural network may predict or determine the irregular processing parameters of the semiconductor processing apparatus 110.

Employing one or more computationally intelligent and/or machine learning techniques, the flow field control circuitry 130 may learn (e.g., by developing and/or updating a machine learning algorithm or model based on training data) to predict or determine the irregular processing parameters.

The machine learning circuitry 140 may be implemented in one or more processors having access to instructions, which may be stored in any computer-readable storage medium, which may be executed by the machine learning circuitry 140 to perform any of the operations or functions described herein.

In some embodiments, the machine learning circuitry 140 is communicatively coupled to a processing parameters database 142, which may be stored, for example, in any computer-readable storage medium. The processing parameters database 142 may include information that associates sensed parameters (e.g., as sensed by the sensors 34a-34d) with irregular processing parameters of the semiconductor processing apparatus 110. In some embodiments, the processing parameters database 142 stores a plurality of historical (e.g., past) sensor data having known outcomes or otherwise representing a known irregular processing parameter or condition of the semiconductor processing apparatus 110.

In some embodiments, the machine learning circuitry 140 may be trained based on the historical processing parameters stored in the processing parameters database 142. That is, the historical processing parameter data may be provided as training data for training the machine learning circuitry 140, and the algorithm or machine learning model contained within or accessible to the machine learning circuitry 140 may be updated or modified based on the historical processing parameters stored in the processing parameters database 142, so that the trained machine learning circuitry 140 may predict or determine irregular processing parameters of the semiconductor processing apparatus 110.

In some embodiments, the training data (e.g., historical processing parameter data stored in the processing parameters database 142) may be or include labeled training data from which the machine learning circuitry 140 or the flow field control circuitry 130 may learn to predict or determine irregular processing parameters of the semiconductor processing apparatus 110. The labeled training data may include labels indicating that one or more of the processing parameter data stored in the processing parameters database 142 represents, for example, irregular processing parameters of the semiconductor processing apparatus 110.

During use of the semiconductor processing apparatus 110, the various processing parameters sensed by the sensors 34a-34d are processed by the signal processing circuitry 120, and the processed signals may then be analyzed by the flow field control circuitry 130 or the machine learning circuitry 140 to determine current processing parameters and/or irregular processing parameters of the semiconductor processing apparatus 110. The flow field control circuitry 130 or the machine learning circuitry 140 may analyze the received signals, for example, by comparing the received signals with historical signals associated with historical processing parameters stored in the processing parameters database 142 which are known to be associated with irregular processing parameters or the like. In some embodiments, the flow field control circuitry 130 or the machine learning circuitry 140 may analyze the received processing parameter sensor data by utilizing a trained machine learning model, such as a neural network or the like.

In some embodiments, the flow field control circuitry 130 or the machine learning circuitry 140 may include or access a plurality of machine learning models, with each such machine learning models being trained based on sensor data of a particular type (e.g., flow field speed, amount of humidity or water vapor, temperature, or gases present in the processing environment).

In some embodiments, the flow field control circuitry 130 or the machine learning circuitry 140 may analyze sensor data received from a plurality of different sensors of the semiconductor processing apparatus 110 in a combined manner. For example, sensed processing parameter data may be received from each of the sensors 34a-34d of the semiconductor processing apparatus 110. Each of the different sensed processing parameter data may be according a particular weight or coefficient value, for example, by the machine learning circuitry 140 (which may be a neural network, in some embodiments). The weighted sensor data may then be combined into a single signal which concurrently represents the sensor data from all of the separate sensors 34a-34d, and the combined sensor signal may be compared with a machine-learning model to predict or determine irregular processing parameters of the semiconductor processing apparatus 110.

In some embodiments, the flow field control circuitry 130 may provide an output to the controller 24 of the semiconductor processing apparatus 110, based on the predicted or determined irregular processing parameters. The output of the flow field control circuitry 130 may be used by the controller 24 to reduce or mitigate the predicted or determined irregular processing parameters. For example, based on the output of the flow field control circuitry 130, the controller 24 may be operated to control the fan 30 or the fins 32 to adjust the flow field in order to reduce or mitigate the predicted or determined irregular processing parameters. For example, based on a predicted or determined irregular temperature, humidity, or flow speed, as provided and output by the flow field control circuitry 130, the controller 24 may control the speed of the fan 30, the direction of the fan 30 (e.g., the orientation or angle of the fins 32), the frequency of the fan 30, or the angle of opening of the door of the load port 20 in order to correct or otherwise mitigate the undesired effects of the irregular temperature, humidity, or flow speed during processing of a wafer in the semiconductor processing apparatus 110.

In some embodiments, the flow field control circuitry 130 or the machine learning circuitry 140 may be trained based on training data indicative of recommended adjustments to speed of the fan 30, the direction of the fan 30 (e.g., the orientation or angle of the fins 32), the frequency of the fan 30, or the angle of opening of the door of the load port 20 in order to correct or otherwise mitigate the undesired effects of the irregular temperature, humidity, or flow speed during processing of a wafer in the semiconductor processing apparatus 110.

In some embodiments, the flow field control circuitry 130 or the machine learning circuitry 140 may receive recipe information associated with particular semiconductor processing recipes which are utilized for processing wafers in the semiconductor processing apparatus 110. Recipe information, such as gas molecule composition, temperature information, humidity information, or flow speed information, may be utilized by the semiconductor processing apparatus 110 to perform particular processes. In some embodiments, recipe information may be associated with particular processing parameters, and historical recipe information associated with historical irregular processing parameters may be stored, for example, in the processing parameters database 142. During use, the particular recipe for a particular process performed by the semiconductor processing apparatus 110 may be received by the flow field control circuitry 130 or the machine learning circuitry 140, and the sensed parameters (e.g., as sensed by the sensors 34a-34d) during operation of the semiconductor processing apparatus 110 may be compared to or otherwise analyzed by the flow field control circuitry 130 or the machine learning circuitry 140 with respect to historical processing parameters associated with the same recipe stored in the processing parameters database 142.

In some embodiments, recommended adjustments to speed of the fan 30, the direction of the fan 30 (e.g., the orientation or angle of the fins 32), the frequency of the fan 30, or the angle of opening of the door of the load port 20 in order to correct or otherwise mitigate the undesired effects of the irregular temperature, humidity, or flow speed during processing of a wafer in the semiconductor processing apparatus 110 may be provided with respect to a particular recipe implemented by the semiconductor processing apparatus 110.

Figure 3:
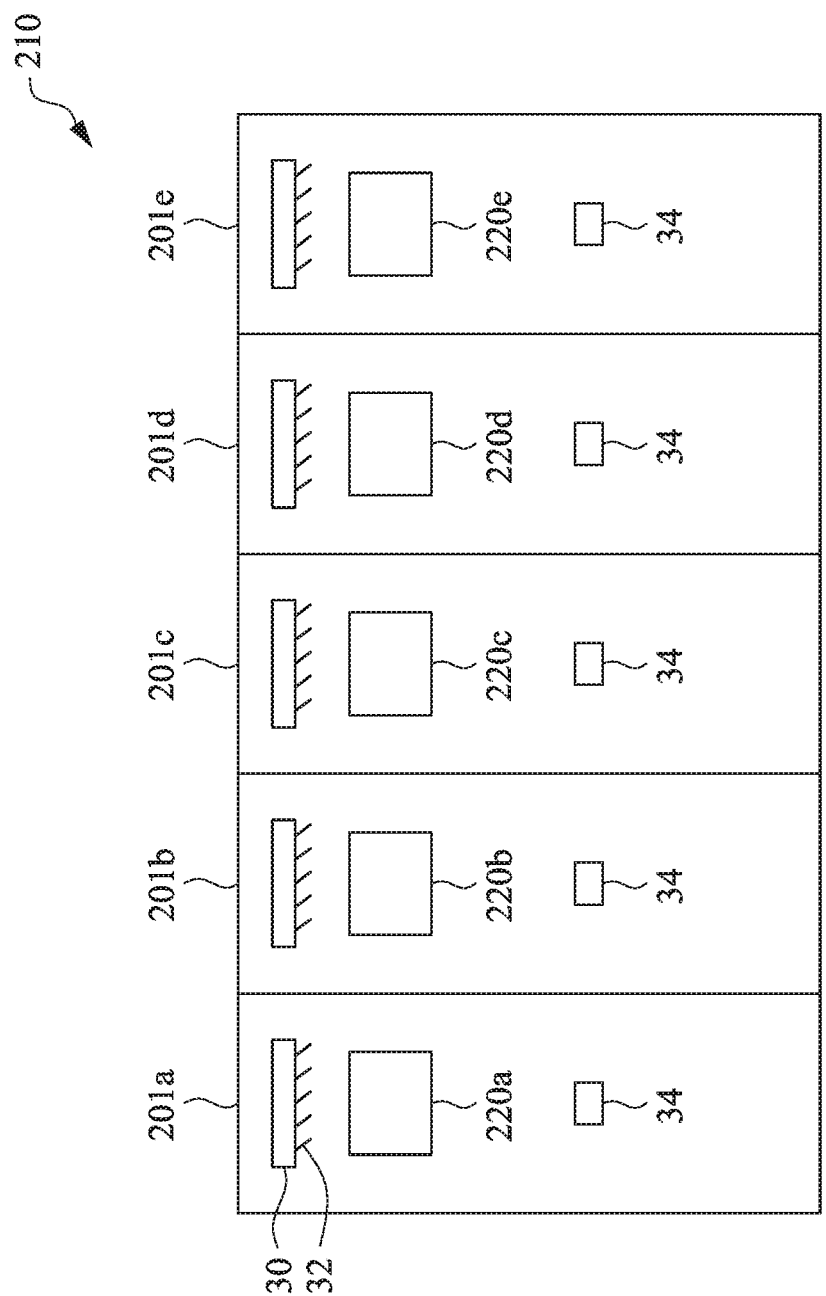
FIG. 3 is a schematic diagram illustrating a semiconductor processing apparatus, in accordance with some embodiments.

FIG. 3 is a schematic diagram illustrating a semiconductor processing apparatus 210, in accordance with one or more embodiments of the present disclosure. The semiconductor processing apparatus 210 illustrated in FIG. 3 may be, for example, an etching-related semiconductor processing tool, such as a dry etching or plasma etching tool; however, embodiments of the present disclosure are not limited thereto. In various embodiments, the semiconductor processing apparatus 210 may be any apparatus or processing tool which is utilized in the processing of semiconductor devices.

The semiconductor processing apparatus 210 shown in FIG. 3 includes a plurality of process chambers 201a-201e, which may be etching chambers in some embodiments. Each of the process chambers 201a-201d may include some or all of the features of the semiconductor processing apparatus 10 shown and described previously herein with respect to FIG. 1.

Each of the process chambers 201a-201e may include a respective load port 220a-220e. The load ports 220a-220e are configured to receive semiconductor wafers which may be carried, for example, by a FOUP. In some embodiments, the FOUP transports wafers between the various process chambers 201a-201e, so that the wafers may be processed in one or more of the process chambers 201a-201e.

Each of the process chambers 201a-201e may include a fan 30 and fins 32, which may be substantially the same as previously described herein. In some embodiments, the fan 30 and fins 32 may be provided above the load ports 220a-220b. Accordingly, the fan 30 and fins 32 may provide and control a fluid field which flows over the load ports 220a-220e. In some embodiments, the fluid field is provided to the wafers within the load ports 220a-220e (e.g., within the FOUP that is loaded into the load ports). In some embodiments, each of the process chambers 201a-201e may include a wafer stage or other structure on which the wafers are positioned during processing in the process chambers 201a-201e, and the fan 30 and fins 32 provide and control the fluid field which flows over the wafer as positioned in the process chambers 201a-201c.

Each of the process chambers 201a-201e may include at least one sensor 34, which may be one or more of a flow meter, a hygrometer, a thermometer, or a gas detector, as previously described herein.

The semiconductor processing apparatus 210 may be utilized in the semiconductor processing flow field control system 100 shown and described with respect to FIG. 2. For example, the semiconductor processing apparatus 210 may be included as the semiconductor processing apparatus 110 shown in FIG. 2. In operation, various processing parameters are sensed by the sensors 34 and the flow field control circuitry 130 and machine learning circuitry 140 may be utilized to predict or detect irregular processing parameters of the semiconductor processing apparatus 210 based on the sensed parameters.

In some embodiments, the flow field control circuitry 130 or the machine learning circuitry 140 may receive recipe information associated with particular semiconductor processing recipes utilized for processing wafers in each of the chambers 201a-201e of the semiconductor processing apparatus 210. The recipe information may include, for example, gas molecule composition, temperature information, humidity information, or flow speed information for processing wafers in each of the chambers 201a-201e of the semiconductor processing apparatus 210. During use, the particular recipe for a particular process performed by the chambers 201a-201e of the semiconductor processing apparatus 210 may be received by the flow field control circuitry 130 or the machine learning circuitry 140, and the sensed parameters (e.g., as sensed by the sensors 34) during operation of each of the chambers 201a-201e of the semiconductor processing apparatus 210 may be compared to or otherwise analyzed by the flow field control circuitry 130 or the machine learning circuitry 140 with respect to historical processing parameters associated with the same recipe stored in the processing parameters database 142.

In some embodiments, recommended adjustments to speed of the fan 30, the direction of the fan 30 (e.g., the orientation or angle of the fins 32), the frequency of the fan 30, or the angle of opening of the door of the load ports 220a-220e in order to correct or otherwise mitigate the undesired effects of the irregular temperature, humidity, or flow speed during processing of a wafer in the semiconductor processing apparatus 210 may be provided with respect to a particular recipe implemented by the semiconductor processing apparatus 210. In some embodiments, the flow field control circuitry 130 or machine learning circuitry 140 further receives information indicating a number of wafers in the FOUP which are to be processed by the chambers 201a-201e of the semiconductor processing apparatus 210. The processing parameters associated with irregular processing parameters, e.g., by the flow field control circuitry 130 or machine learning circuitry 140 may be associated with particular numbers of wafers in the FOUP, and the detection or prediction of irregular processing parameters may be based, at least in part, on the number of wafers in the FOUP in a particular chamber 201a-201e in which the wafers are processed.

Figure 4:
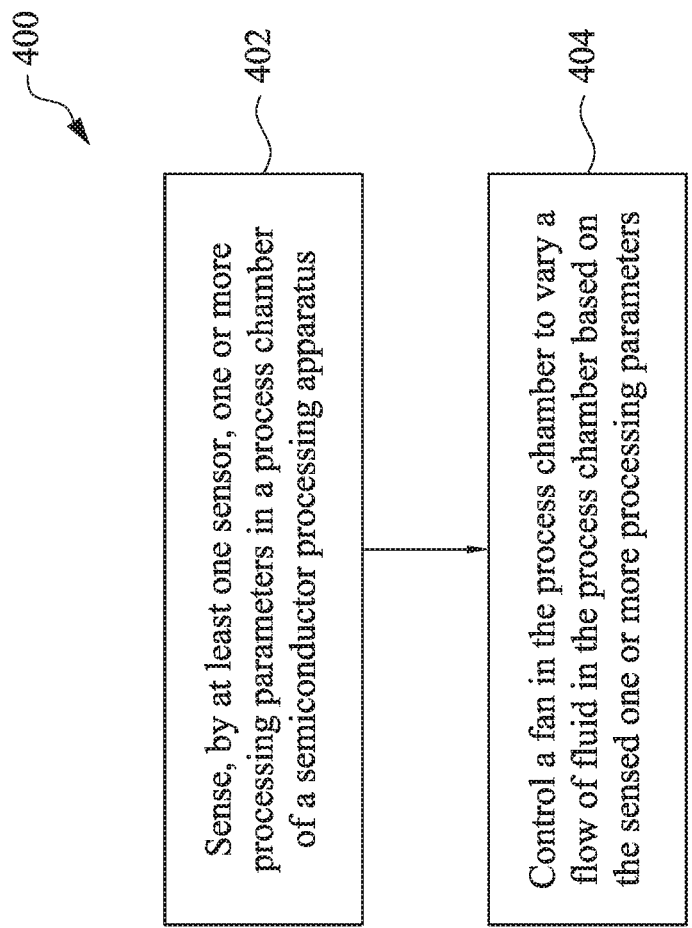
FIG. 4 is a flowchart illustrating a process chamber fan control method, in accordance with some embodiments.

FIG. 4 is a flowchart 400 illustrating a process chamber fan control method, in accordance with one or more embodiments. The method may be implemented at least in part, for example, by the semiconductor processing apparatus 10 shown in and described with respect to FIG. 1, the processing flow field control system 100 shown in and described with respect to FIG. 2, or the semiconductor processing apparatus 210 shown in and described with respect to FIG. 3.

At 402, the method includes sensing, by at least one sensor, one or more processing parameters in a process chamber of a semiconductor processing apparatus. The processing parameters may be sensed, for example, by one or more sensors 34, which may be one or more of a flow meter, a hygrometer, a thermometer, or a gas detector.

At 404, the method includes controlling a fan in the process chamber to vary a flow of fluid in the process chamber based on the sensed one or more processing parameters. The fan may be controlled, for example, by a controller 24. In some embodiments, the controller may control at least one of a speed of the fan, a direction of the flow of fluid in the process chamber, or a frequency of the fan. In some embodiments, the method may include determining an irregular processing parameter in the process chamber based on the sensed one or more processing parameters, and the fan may be controlled to vary the flow of fluid in the process chamber to correct the irregular processing parameter.

Embodiments of the present disclosure provide several advantages, and provide technical solutions to technical problems that are present, for example, within the field of semiconductor processing apparatuses, systems, and methods. For example, embodiments of the disclosure are operable to control a flow field in a process chamber based on sensed parameters in the process chamber. This provides a significant advantage over conventional systems in which a flow field is not controlled based on any sensed parameters of the semiconductor apparatus, which can result in defects due to outgassing or other irregular parameters within a process chamber during processing. This can further result in increased costs and reduced profits, as defective wafers may be scrapped or may need further processing to mitigate the defects due to irregular processing parameters. However, embodiments of the present disclosure can avoid or reduce such defects by controlling the flow field within the process chamber based on the sensed parameters in the process chamber, thereby reducing or eliminating defects from occurring due to process conditions, outgassing, or the like.

According to one embodiment, a semiconductor processing apparatus includes a load port that receives a semiconductor wafer. A process chamber is coupled to the load port, and a fan is configured to selectively vary a flow of fluid in the process chamber. One or more sensors are provided in the process chamber and are configured to sense one or more processing parameters in the process chamber. A controller is coupled to the one or more sensors and to the fan, and the controller is configured to control the fan to vary the flow of fluid in the process chamber based on the sensed processing parameters.

According to another embodiment, a method is provided that includes sensing, by at least one sensor, one or more processing parameters in a process chamber of a semiconductor processing apparatus. The method further includes controlling a fan in the process chamber to vary a flow of fluid in the process chamber based on the sensed one or more processing parameters.

According to yet another embodiment, a semiconductor processing system is provided that includes a plurality of load ports, with each of the load ports configured to receive a semiconductor wafer. A plurality of process chambers are included, with each process chamber coupled to a respective load port. A plurality of fans is included, and at least one fan is positioned in each of the plurality of process chambers.

Each of the plurality of fans is configured to selectively vary a flow of fluid in a respective process chamber. A plurality of sensors is included, and at least one fan is positioned in each of the plurality of process chambers. Each of the plurality of sensors is configured to sense one or more processing parameters in the respective process chamber. A controller is coupled to the plurality of sensors and to the plurality of fans, and the controller is configured to control the fans to vary the flow of fluid in the process chambers based on the sensed processing parameters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor processing apparatus, comprising:
a load port configured to receive a semiconductor wafer;
a process chamber coupled to the load port;
a fan configured to selectively vary a flow of fluid in the process chamber;
one or more sensors configured to sense one or more processing parameters in the process chamber; and
a controller coupled to the one or more sensors and to the fan, the controller configured to control at least one of a speed or a direction of the fan to vary the flow of fluid in the process chamber based on the sensed one or more processing parameters, and control an angle of opening of a door of the load port based on the sensed one or more processing parameters.

2. The apparatus of claim 1 wherein the one or more sensors includes at least one of a flow meter, a hygrometer, a thermometer, or a gas detector.

3. The apparatus of claim 1, further comprising fins mechanically coupled to the fan, the fins having an adjustable angle configured to adjust the direction of the fan to vary the flow of fluid in the process chamber.

4. The apparatus of claim 3 wherein the controller is configured to control a frequency of the fan based on the sensed one or more processing parameters.

5. The apparatus of claim 1, further comprising:
flow field control circuitry communicatively coupled to the one or more sensors, the flow field control circuitry configured to determine an irregular processing parameter of the semiconductor processing apparatus based on the sensed one or more processing parameters.

6. The apparatus of claim 5, further comprising:
a processing parameters database communicatively coupled to the flow field control circuitry, the processing parameters database storing information associated with irregular processing parameters of the semiconductor processing apparatus,
wherein the flow field control circuitry is configured to determine the irregular processing parameter of the semiconductor processing apparatus based on the sensed one or more processing parameters and the information stored in the database.

7. The apparatus of claim 6 wherein the flow field control circuitry is configured to receive recipe information associated with a process performed by the semiconductor processing apparatus, and the information associated with irregular processing parameters stored in the processing parameters database is associated with the received recipe information.

8. The apparatus of claim 5 wherein the flow field control circuitry is configured to output a recommended adjustment to at least one of the speed of the fan, the direction of the flow of fluid, a frequency of the fan, or the angle of opening of the door of the load port, and the controller is configured to control the fan based on the recommended adjustment.

9. The apparatus of claim 1 wherein the load port is positioned between the fan and the one or more sensors.

10. A method, comprising:
sensing, by at least one sensor, one or more processing parameters in a process chamber of a semiconductor processing apparatus, the process chamber coupled to a load port configured to receive a semiconductor wafer;
controlling an operation of a fan in the process chamber to vary at least one of a speed or a direction of a flow of fluid in the process chamber based on the sensed one or more processing parameters; and
controlling an angle of opening of a door of the load port based on the sensed one or more processing parameters.

11. The method of claim 10 wherein the sensing the one or more processing parameters includes sensing at least one of flow field speed, humidity or water vapor, temperature, or gases in the process chamber.

12. The method of claim 10 wherein the controlling an operation of the fan includes controlling a frequency of the fan.

13. The method of claim 10, further comprising:
determining an irregular processing parameter in the process chamber based on the sensed one or more processing parameters,
wherein the controlling an operation of the fan to vary the at least one of a speed or a direction of the flow of fluid in the process chamber includes controlling the fan to vary the flow of fluid in the process chamber to correct the irregular processing parameter.

14. The method of claim 13 wherein the determining the irregular processing parameter in the process chamber includes comparing the sensed one or more processing parameters with irregular processing parameters stored in a database.

15. The method of claim 13 wherein the determining the irregular processing parameter in the process chamber includes determining, by machine learning circuitry, the irregular processing parameter based on the sensed one or more processing parameters and based on recipe information associated with a particular process performed by the semiconductor processing apparatus.

16. A semiconductor processing system, comprising:
a plurality of load ports, each of the load ports configured to receive a semiconductor wafer;

a plurality of process chambers respectively coupled to the plurality of load ports;

a plurality of fans respectively positioned in the plurality of process chambers, each of the plurality of fans configured to selectively vary a flow of fluid in a respective process chamber;

a plurality of sensors respectively positioned in the plurality of process chambers, each of the plurality of sensors configured to sense one or more processing parameters in the respective process chamber; and a controller coupled to the plurality of sensors and to the plurality of fans, the controller configured to control an operation of the fans to vary at least one of a speed or a direction of the flow of fluid in the process chambers based on the sensed one or more processing parameters, and control an angle of opening of a door of at least one of the plurality of load ports based on the sensed one or more processing parameters.

17. The system of claim 16, further comprising:

flow field control circuitry communicatively coupled to the plurality of sensors, the flow field control circuitry configured to determine irregular processing parameters of the plurality of process chambers based on the sensed one or more processing parameters.

18. The system of claim 17, further comprising:

a processing parameters database communicatively coupled to the flow field control circuitry, the processing parameters database storing information associated with the irregular processing parameters of the plurality of process chambers, wherein the flow field control circuitry is configured to determine the irregular processing parameters of the plurality of process chambers based on the sensed one or more processing parameters and the information stored in the database.

19. The system of claim 18 wherein the flow field control circuitry is configured to receive recipe information associated with processes performed in each of the plurality of process chambers, and the information associated with the irregular processing parameters stored in the processing parameters database is associated with the received recipe information.

20. The system of claim 16 wherein the plurality of sensors includes at least one of a flow meter, a hygrometer, a thermometer, or a gas detector.

* * * * *